United States Patent
Ando et al.

(10) Patent No.: US 10,319,846 B1
(45) Date of Patent: Jun. 11, 2019

(54) MULTIPLE WORK FUNCTION NANOSHEET FIELD-EFFECT TRANSISTORS WITH DIFFERENTIAL INTERFACIAL LAYER THICKNESS

(71) Applicant: International Business Machines Corporation, Armonk, NY (US)

(72) Inventors: Takashi Ando, Tuckahoe, NY (US); ChoongHyun Lee, Rensselaer, NY (US); Jingyun Zhang, Albany, NY (US); Pouya Hashemi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/975,364

(22) Filed: May 9, 2018

(51) Int. Cl.
| | |
|---|---|
| *H01L 21/28* | (2006.01) |
| *H01L 29/775* | (2006.01) |
| *H01L 21/8238* | (2006.01) |
| *H01L 21/477* | (2006.01) |
| *H01L 27/12* | (2006.01) |
| *H01L 27/092* | (2006.01) |
| *H01L 29/49* | (2006.01) |

(52) U.S. Cl.
CPC .......... *H01L 29/775* (2013.01); *H01L 21/477* (2013.01); *H01L 21/823807* (2013.01); *H01L 27/092* (2013.01); *H01L 27/1203* (2013.01); *H01L 29/4958* (2013.01)

(58) Field of Classification Search
CPC ....... H01L 21/477; H01L 21/28; H01L 21/00; H01L 21/28176; H01L 21/28088; H01L 21/8238; H01L 21/823807
USPC .............................................................. 257/9
See application file for complete search history.

(56) References Cited

U.S. PATENT DOCUMENTS

| | | | |
|---|---|---|---|
| 9,647,098 | B2 | 5/2017 | Obradovic et al. |
| 9,735,250 | B2 | 8/2017 | Ando et al. |
| 9,812,449 | B2 * | 11/2017 | Obradovic ............ H01L 27/088 |

(Continued)

OTHER PUBLICATIONS

T. Ando et al., "Origins of Effective Work Function Roll-Off Behavior for High-k Last Replacement Metal Gate Stacks," IEEE Electron Device Letters, Jun. 2013, pp. 729-731, vol. 34, No. 6.

(Continued)

*Primary Examiner* — Chuong A Luu
(74) *Attorney, Agent, or Firm* — Vazken Alexanian; Ryan, Mason & Lewis, LLP

(57) ABSTRACT

A semiconductor structure includes a substrate, an isolation layer disposed over the substrate, a plurality of nanosheet channels, interfacial layers surrounding each of the nanosheet channels, and dielectric layers surrounding each of the interfacial layers. The plurality of nanosheet channels includes first and second sets of two or more nanosheet channels for first and second NFETs and third and fourth sets of two or more nanosheet channels for first and second PFETs. The interfacial layers surrounding the first and third sets of nanosheet channels for the first NFET and the first PFET have a first thickness, and interfacial layers surrounding the second and fourth sets of nanosheets channels for the second NFET and the second PFET have a second thickness smaller than the first thickness. The first NFET has a higher threshold voltage than the second NFET, and the first PFET has a lower threshold voltage than the second PFET.

10 Claims, 9 Drawing Sheets

(56) References Cited

U.S. PATENT DOCUMENTS

2015/0021699 A1    1/2015  Ando et al.
2017/0256611 A1*   9/2017  Kim .................... H01L 29/0673
2017/0323949 A1*  11/2017  Loubet .............. H01L 29/42392

OTHER PUBLICATIONS

C.-H. Lin et al., "High Performance 14nm SOI FinFET CMOS Technology with 0.0174μm2 Embedded DRAM and 15 Levels of Cu Metallization," IEEE International Electron Devices Meeting (IEDM), Dec. 15-17, 2014, pp. 74-76.

S. Guha et al., "Oxygen Vacancies in High Dielectric Constant Oxide-Semiconductor Films," Physical Review Letters (PRL), May 11, 2007, 4 pages, vol. 98, No. 19.

* cited by examiner

MULTIPLE WORK FUNCTION NANOSHEET FIELD-EFFECT TRANSISTORS WITH DIFFERENTIAL INTERFACIAL LAYER THICKNESS

BACKGROUND

The present application relates to semiconductors, and more specifically, to techniques for forming semiconductor structures. Fin field-effect transistors (FinFETs) are used in state-of-the-art complementary metal-oxide-semiconductor (CMOS) devices. Gate-all-around architectures, such as nanosheet technology, are an evolution of FinFET devices with a device channel comprising one or more layers of nanosheets. Each nanosheet has a vertical thickness substantially less than the width of that nanosheet. Gate structures may be formed above and below each nanosheet.

SUMMARY

Embodiments of the invention provide techniques for forming multiple work function nanosheet field-effect transistors with differential interfacial layer thickness.

In one embodiment, a semiconductor structure comprises a substrate, an isolation layer disposed over the substrate, a plurality of nanosheet channels, interfacial layers surrounding each of the nanosheet channels and dielectric layers surrounding each of the interfacial layers. The plurality of nanosheet channels comprise a first set of two or more nanosheet channels for a first negative-channel field-effect transistor (NFET), a second set of two or more nanosheet channels for a second NFET, a third set of two or more nanosheet channels for a first positive-channel field-effect transistor (PFET) and a fourth set of two or more nanosheet channels for a second PFET. The interfacial layers surrounding the first set of two or more nanosheet channels for the first NFET and the interfacial layers surrounding the third set of two or more nanosheet channels for the first PFET have a first thickness. The interfacial layers surrounding the second set of two or more nanosheet channels for the second NFET and the interfacial layers surrounding the fourth set of two or more nanosheet channels for the second PFET have a second thickness smaller than the first thickness.

In another embodiment, an integrated circuit comprises a nanosheet field-effect transistor (FET) device comprising a substrate, an isolation layer disposed over the substrate, a plurality of nanosheet channels, interfacial layers surrounding each of the nanosheet channels, and dielectric layers surrounding each of the interfacial layers. The plurality of nanosheet channels comprising a first set of two or more nanosheet channels for a first NFET, a second set of two or more nanosheet channels for a second NFET, a third set of two or more nanosheet channels for a first PFET and a fourth set of two or more nanosheet channels for a second PFET. The interfacial layers surrounding the first set of two or more nanosheet channels for the first NFET and the interfacial layers surrounding the third set of two or more nanosheet channels for the first PFET have a first thickness. The interfacial layers surrounding the second set of two or more nanosheet channels for the second NFET and the interfacial layers surrounding the fourth set of two or more nanosheet channels for the second PFET have a second thickness smaller than the first thickness.

In another embodiment, a method of forming a semiconductor structure comprises forming a plurality of nanosheet channels disposed over an isolation layer disposed over a substrate, the plurality of nanosheet channels comprising a first set of two or more nanosheet channels for a first NFET, a second set of two or more nanosheet channels for a second NFET, a third set of two or more nanosheet channels for a first PFET and a fourth set of two or more nanosheet channels for a second PFET. The method also comprises forming interfacial layers surrounding each of the nanosheet channels, forming dielectric layers surrounding each of the nanosheet channels, forming a first capping metal layer over the first set of two or more nanosheet channels for the first NFET and the third set of two or more nanosheet channels for the first PFET, forming a second capping metal layer different than the first capping metal layer over the second set of two or more nanosheet channels for the second NFET and the fourth set of two or more nanosheet channels for the second PFET, and performing an anneal to selectively thin the interfacial layers surrounding the second set of two or more nanosheet channels for the second NFET and the fourth set of two or more nanosheet channels for the second PFET.

DETAILED DESCRIPTION

Figure 1:
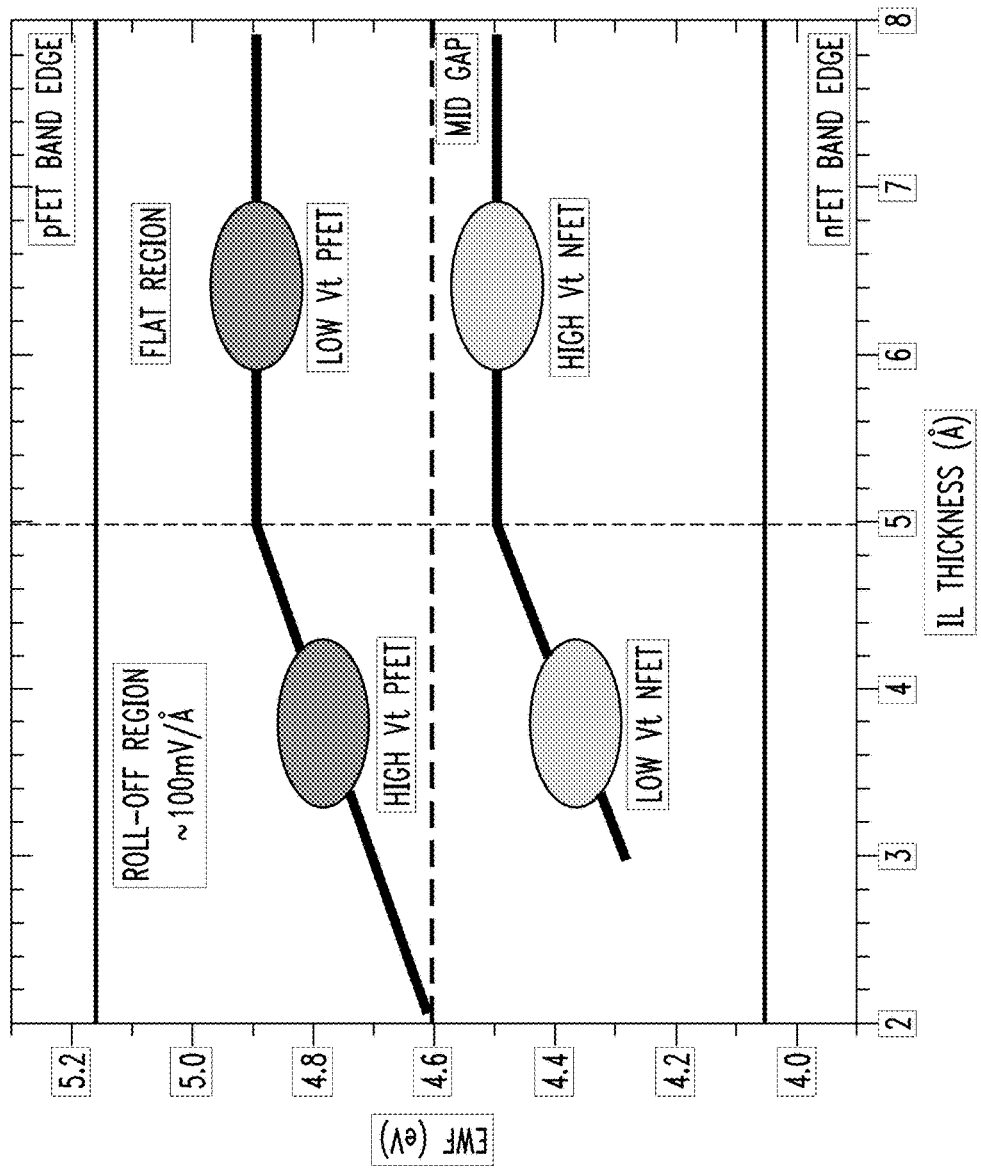
FIG. 1 depicts a plot of effective work function and interfacial layer thickness for low and high threshold voltage positive channel and negative channel field-effect transistor devices, according to an embodiment of the present invention.

Illustrative embodiments of the invention may be described herein in the context of illustrative methods for forming multiple work function nanosheet field-effect transistors with differential interfacial layer thickness, along with apparatus, systems and devices formed using such methods. However, it is to be understood that embodiments of the invention are not limited to the illustrative methods, apparatus, systems and devices but instead are more broadly applicable to other suitable methods, apparatus, systems and devices.

Multiple work function gate stacks are used to achieve complementary metal-oxide-semiconductor (CMOS) technology with multiple threshold voltages (Vt) on fully depleted channel architectures (e.g., fin field-effect transistors (FinFETs) and nanosheet field-effect transistors (FETs), etc.). Multiple work function gate stacks in some cases are particularly important for taking advantage of higher mobility and smaller device variability due to the absence of channel doping. Multiple Vt devices may be formed by doping channel regions, but this is not an option as certain device types (e.g., FinFETs, nanosheet FETs) continue to scale to smaller sizes.

Some multiple work function schemes utilize patterning steps after deposition of a high-k dielectric surrounding the channels to pattern work function setting metal or dipole formation elements such as lanthanum (La), aluminum (Al), etc. For nanosheet devices, however, the space between sheets may not be large enough to perform such patterning steps following deposition of the high-k dielectric.

Illustrative embodiments provide techniques for forming multiple work function nanosheet FETs through differential interfacial layer (IL) thickness surrounding the nanosheets of different regions of a device. The differential IL thickness is used to create two levels of effective work function (EWF) for negative channel field-effect transistor (NFET) and positive channel field-effect transistor (PFET) regions or portions of a nanosheet FET device. Through the use of differential IL thickness, embodiments avoid the need for patterning additional films between nanosheets to achieve multiple work function nanosheet FETs.

In some embodiments, a nanosheet FET device includes silicon (Si) nanosheets for both NFET and PFET. The nanosheets are surrounded by a dielectric layer (e.g., a high-k dielectric such as hafnium oxide ($HfO_2$)), with an IL being formed between the nanosheets and the dielectric layer. The IL may be silicon dioxide ($SiO_2$)-based. The nanosheet FET devices may include both high and low Vt NFET and PFET devices, with the thickness of the IL varying between such regions. For the high Vt NFET and low Vt PFET devices, the thickness of the IL may be greater than 5 angstroms (Å). For the low Vt NFET and high Vt PFET devices, the thickness of the IL may be smaller than 5 Å. The varying thickness of the IL layer may control the Vt drop-off between the "high" and "low" Vt NFET and PFET devices. In some embodiments, the Vt drop-off is approximately 100 millivolts (mV) per Å (mV/Å) for IL thicknesses below 5 Å.

Different work function setting metals may be used for the NFET and PFET devices. In some embodiments, the NFET work function metal (WFM) may be a multilayer of titanium nitride (TiN), an Al-containing alloy (e.g., titanium aluminum carbide (TiAlC)), and TiN, such that the multilayer is TiN/TiAlC/TiN. The NFET WFM may have an EWF in the range of 4.4-4.5 electronvolts (eV). The PFET WFM may be TiN, with an EWF in the range of 4.8-5.0 eV.

Differential IL thickness may be achieved by forming different capping metals in different regions of the structure so that controlled IL scavenging occurs in desired regions during a reliability anneal. The capping metal for high Vt NFET and low Vt PFET regions may be TiN, with a thickness of approximately 25 Å, adjusted to pinch off the spaces between the nanosheets. The capping metal for the low Vt NFET and high Vt PFET devices may be a multilayer, such as 10 Å TiN, 15 Å Al-containing alloy (e.g., TiAlC), and 10 Å TiN. The thickness of the Al-containing alloy may be adjusted to pinch off the spaces between the nanosheets.

FIG. 1 shows a plot 100, illustrating multi-EWF achieved through differential IL thickness. The plot 100 shows the change in EWF resulting from varying IL thickness for both the high and low Vt NFET and high and low Vt PFET devices. As can be seen, two levels of Vt can be set for the NFET and PFET regions by changing the IL thickness. There is a "flat" region above 5 Å IL thickness for the low Vt PFET and high Vt NFET devices. There is a "roll-off" region below 5 Å IL thickness for the high Vt PFET and low Vt NFET devices, where the roll-off in EWF is approximately 100 mV/Å. The Vt separation for "high" and "low" Vt devices is controllable through adjustment of the IL thickness.

Figure 2:
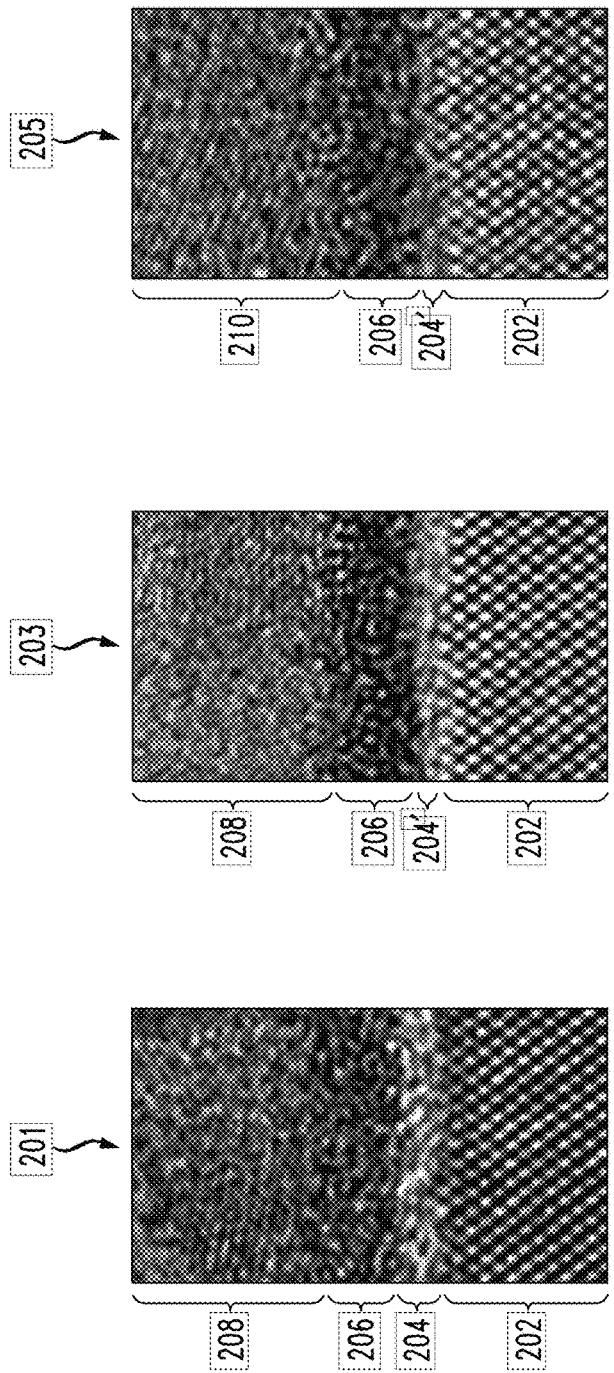
FIG. 2 depicts images of a structure during an interfacial layer scavenging process, according to an embodiment of the present invention.

FIG. 2 shows images 201, 203 and 205 of a structure during an IL scavenging process. More particularly, the images 201, 203 and 205 illustrate processing steps in a replacement metal gate (RMG) processing flow. The image 201 shows a portion of a structure after dummy gate removal. The structure includes a Si or substrate layer 202, over which an IL 204 (e.g., $SiO_2$-based) and a high-k dielectric layer (e.g., $HfO_2$) are formed. The image 201 further illustrates the structure after deposition of a sacrificial metal gate 208. The image 203 shows the structure of image 201 after poly-silicon (poly-Si) deposition and removal. As shown in image 203, the IL 204' is substantially reduced at this step. The image 205 shows the structure after further processing, including removal of the sacrificial metal gate 208, deposition of a work function setting metal (e.g., a NFET WFM), deposition of Al, and following a 400° C. furnace anneal. As illustrated, the thickness of the IL 204' is maintained during such processing.

A process for forming multiple work function nanosheet FETs with differential IL thickness will now be described with respect to FIGS. 3-9.

Figure 3:
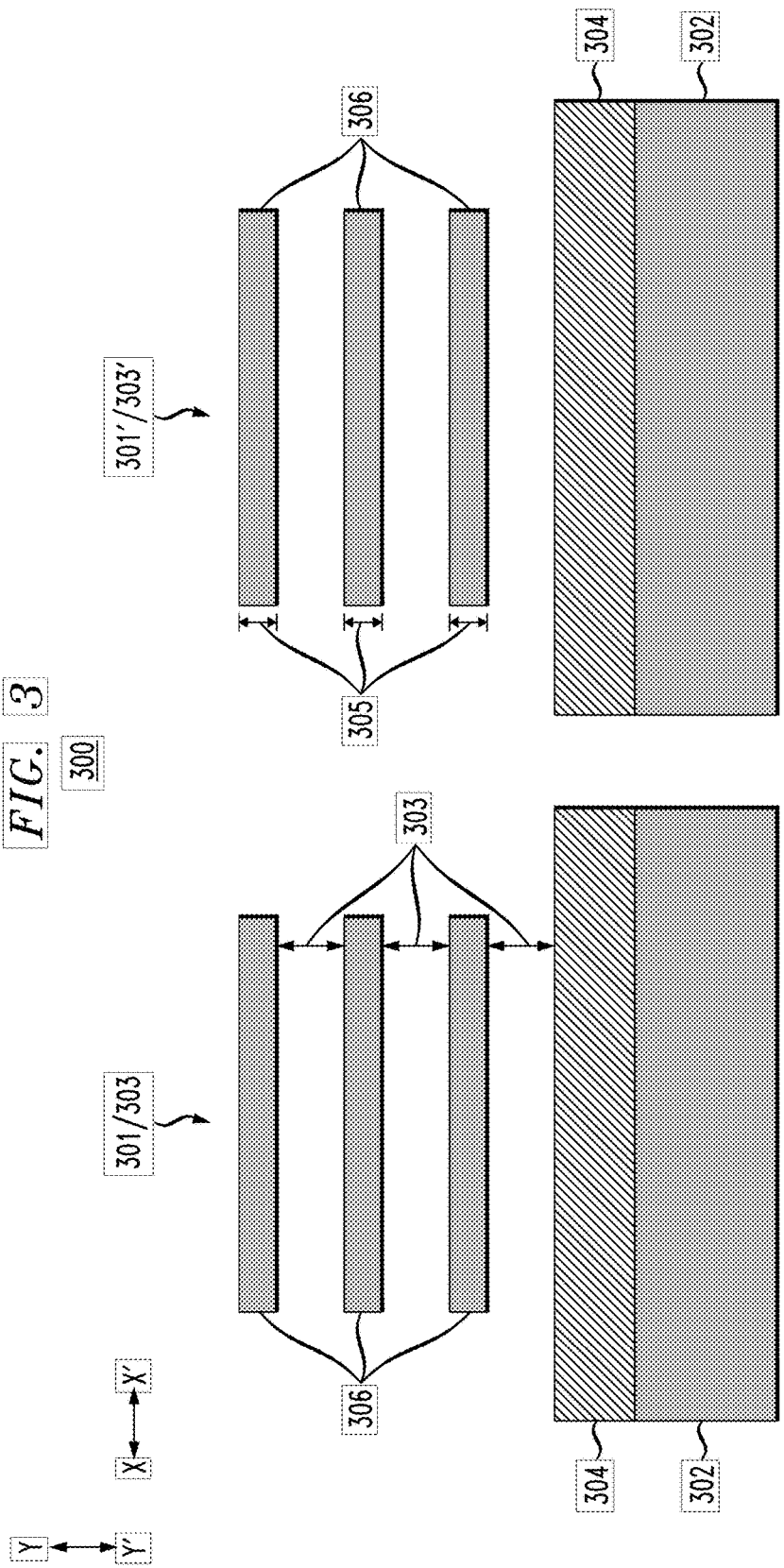
FIG. 3 depicts a cross-sectional view of different regions of a semiconductor structure following channel release, according to an embodiment of the present invention.

FIG. 3 shows a side cross-sectional view 300 of different regions of a structure. The regions denoted 301/303 in FIG. 3 illustrate portions of the structure that are used to form high Vt NFET nanosheet devices (e.g., 301) and low Vt PFET nanosheet devices (e.g., 303). The regions denoted 301'/303' in FIG. 3 illustrate portions of the structure that are used to form low Vt NFET nanosheet devices (301') and high Vt PFET nanosheet devices (e.g., 303'). It should be appreciated that multiple high and/or low Vt NFET and PFET nanosheet devices or regions may be formed as desired, although only single instances of such are described with respect to FIGS. 3-9 for clarity of illustration.

The FIG. 3 structure includes a substrate 302, which may be formed of bulk Si or another suitable material such as Si on insulator (SOI). An isolation layer 304 is formed over the substrate 302. The isolation layer 304 may be formed of a dielectric material such as $SiO_2$. The isolation layer 304 may have a vertical thickness (in direction Y-Y') ranging from 5 nm to 20 nm.

The structure of FIG. 3 is shown post channel release, where a sacrificial material formed between nanosheet channels 306 is removed. The nanosheet channels 306 may be formed of Si, although other suitable materials such as silicon germanium (SiGe) may be used. The suspension thickness ($T_{sus}$) 303 between the nanosheet channels 306 may be 9.5 nanometers (nm), or more generally in the range of 6 nm to 12 nm. Each of the nanosheet channels 306 may have a vertical thickness 305 of 6 nm, or more generally a thickness 305 in the range of 4 nm to 10 nm.

Figure 4:
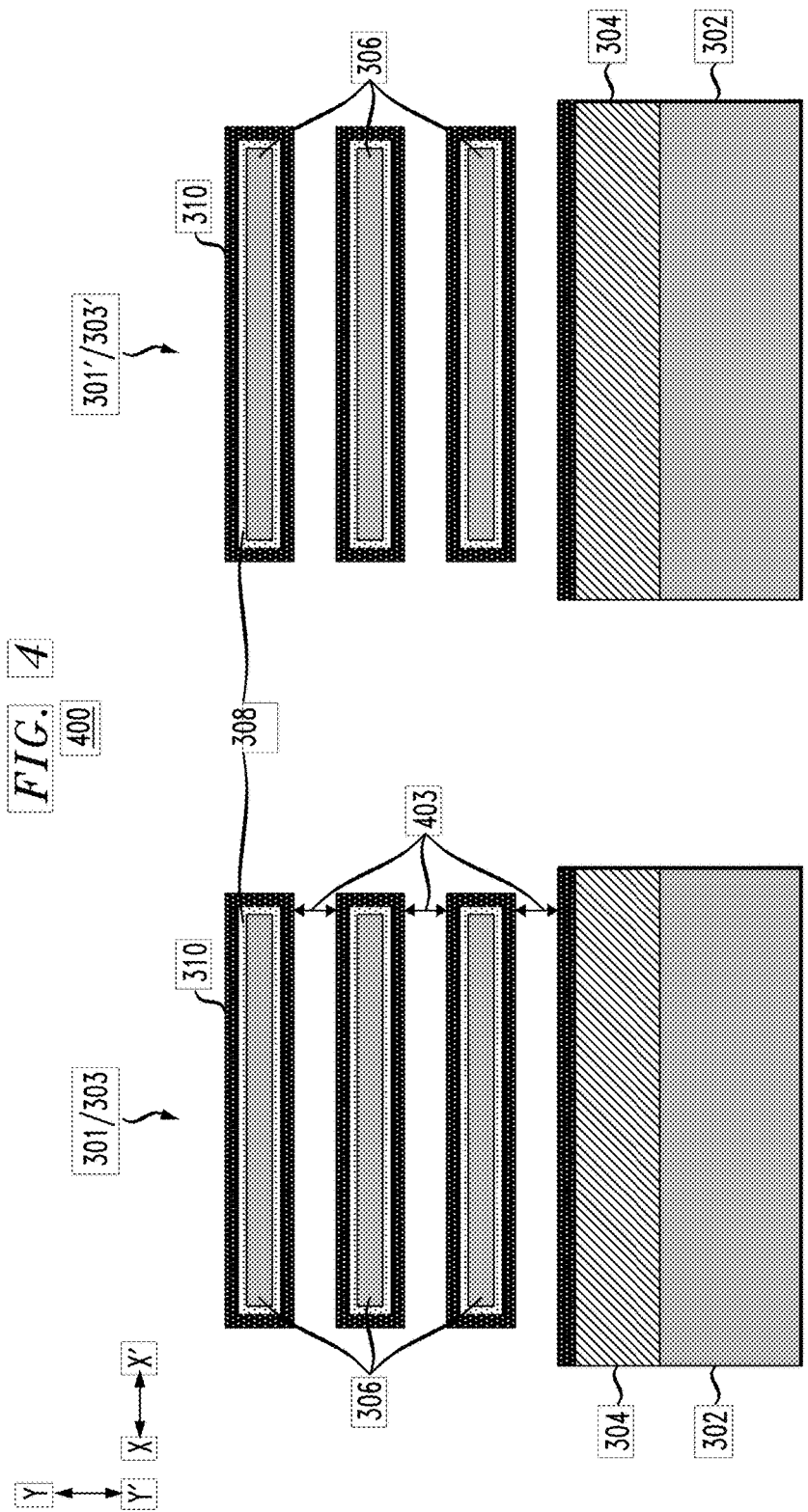
FIG. 4 depicts a cross-sectional view of the FIG. 3 structure following formation of an interfacial layer and a dielectric layer surrounding the nanosheet channels in the different regions of the semiconductor structure, according to an embodiment of the present invention.

FIG. 4 shows a cross-sectional view 400 of the FIG. 4 structure following formation of an IL layer 308 surrounding each of the nanosheet channels 306 (e.g., in all regions 301, 303, 301', 303') and deposition of a dielectric layer 310 surrounding the IL 308 and over the isolation layer 304. The IL layer 308 may be SiO$_2$-based, such as being formed of SiO$_2$, or may be formed of silicon oxynitride (SiON). The IL layer 308 may have a uniform thickness of 0.8 nm, or more generally a uniform thickness in the range of 0.5 nm to 1nm. The IL layer 308 may be formed using chemical treatment, such as ozonated water, SC1, or rapid thermal anneal (RTA) under an oxygen containing ambient.

The dielectric layer 310 may be formed of a high-k dielectric material such as HfO$_2$, although other suitable high-k dielectric materials such as zirconium dioxide (ZrO$_2$), silicates, combinations thereof, etc. may be used. The dielectric layer 310 may be formed using atomic layer deposition (ALD) with a thickness of 1.7 nm, or more generally a thickness in the range of 1.5 nm to 2 nm. In embodiments wherein the IL 308 is formed with a thickness of 0.8 nm and the dielectric layer 310 is formed with a thickness of 1.7 nm, the resulting $T_{sus}$ 403 between the nanosheet channels 306 is reduced to just 4.5 nm.

Figure 5:
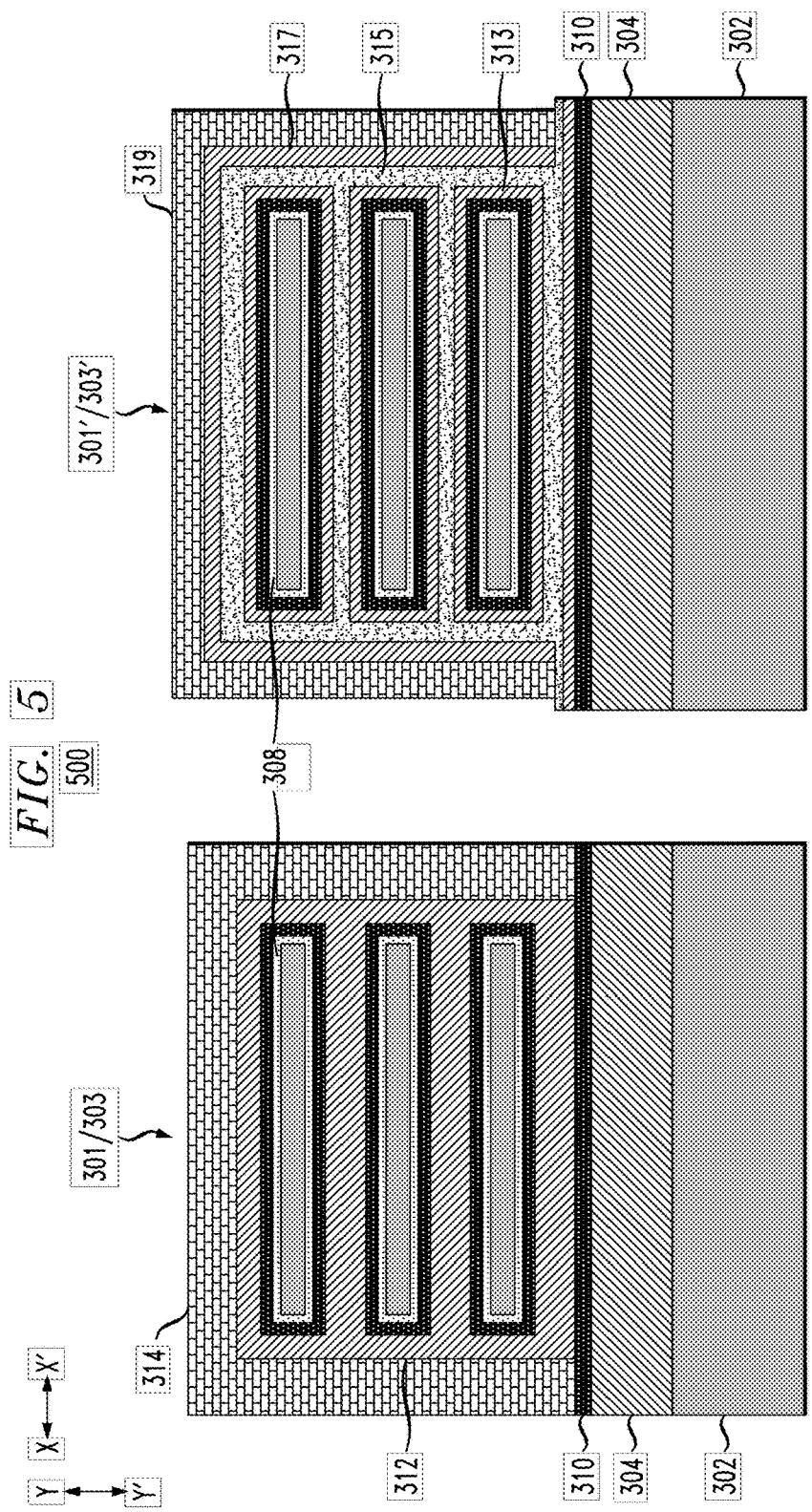
FIG. 5 depicts a cross-sectional view of the FIG. 4 structure following deposition of capping layers in the different regions of the semiconductor structure, according to an embodiment of the present invention.

FIG. 5 shows a cross-sectional view 500 of the FIG. 4 structure following deposition of capping metals and other layers in the regions 301, 301', 303 and 303'. In regions 301 and 303, which correspond to high Vt NFET and low Vt PFET devices, respectively, a capping layer 312 is deposited to surround the nanosheet channels 306 and pinch off the spaces between them. In some embodiments, the capping layer 312 is formed of TiN, although other suitable materials such as tantalum nitride (TaN) may be used. In some embodiments, 25 Å of the capping layer 312 material (e.g., TiN) is deposited. More generally, a sufficient amount of the capping layer 312 material is deposited so as to pinch off an entire space between the nanosheet channels 306 in the regions 301 and 303. An additional layer 314 is deposited over the capping layer 312. The additional layer 314 may be formed of amorphous silicon (a-Si), although other suitable materials such as polysilicon (poly-Si) or silicon nitride (SiN) may be used. The additional layer 314 (e.g., a-Si) may have a thickness of 40 Å, or more generally a thickness in the range of 30 Å to 200 Å.

In regions 301' and 303', which correspond to low Vt NFET and high Vt PFET devices, respectively, the capping metal is a multilayer including layers 313, 315 and 317. The layer 313 may be formed of TiN. The layer 313 may have a thickness of 10 Å, or more generally a thickness in the range of 5 Å to 15 Å. The layer 315 may be formed of an aluminum-containing alloy such as titanium aluminum carbide (TiAlC), although other suitable materials such as a titanium-aluminum (Ti—Al) alloy or tantalum aluminum carbide (TaAlC) may be used. The layer 315 may have a thickness of 15 Å, or more generally a thickness in the range of 10 Å to 50 Å sufficient to pinch off an entire space between the nanosheet channels 306 in regions 301' and 303'. The layer 317 is formed over the layer 315. The layer 317 may be formed of TiN. The layer 317 may have a thickness of 35 Å, or more generally a thickness in the range of 10 Å to 50 Å. An additional layer 319 is formed over the capping metal (e.g., over layer 317). The additional layer 319 may be formed of a-Si, although other suitable materials such as poly-Si or SiN may be used. The additional layer 319 may have a thickness of 40 Å, or more generally a thickness in the range of 30 Å to 200 Å.

In some embodiments, a low Vt NFET and high Vt PFET first patterning scheme is used, where the layers 312 and 314 are formed in regions 301 and 303 prior to formation of layers 313, 315, 317 and 319 in regions 301' and 303'. In other embodiments, a high Vt NFET and low Vt PFET first patterning scheme may be used where the layers 313, 315, 317 and 319 are formed in regions 301' and 303' prior to formation of layers 312 and 314 in regions 301 and 303. Suitable blocking or other masking techniques may be used to pattern the layers in the different regions 301/303 and 301'/303' to achieve low Vt NFET and high Vt PFET first patterning or high Vt NFET and low Vt PFET first patterning as desired.

Figure 6:
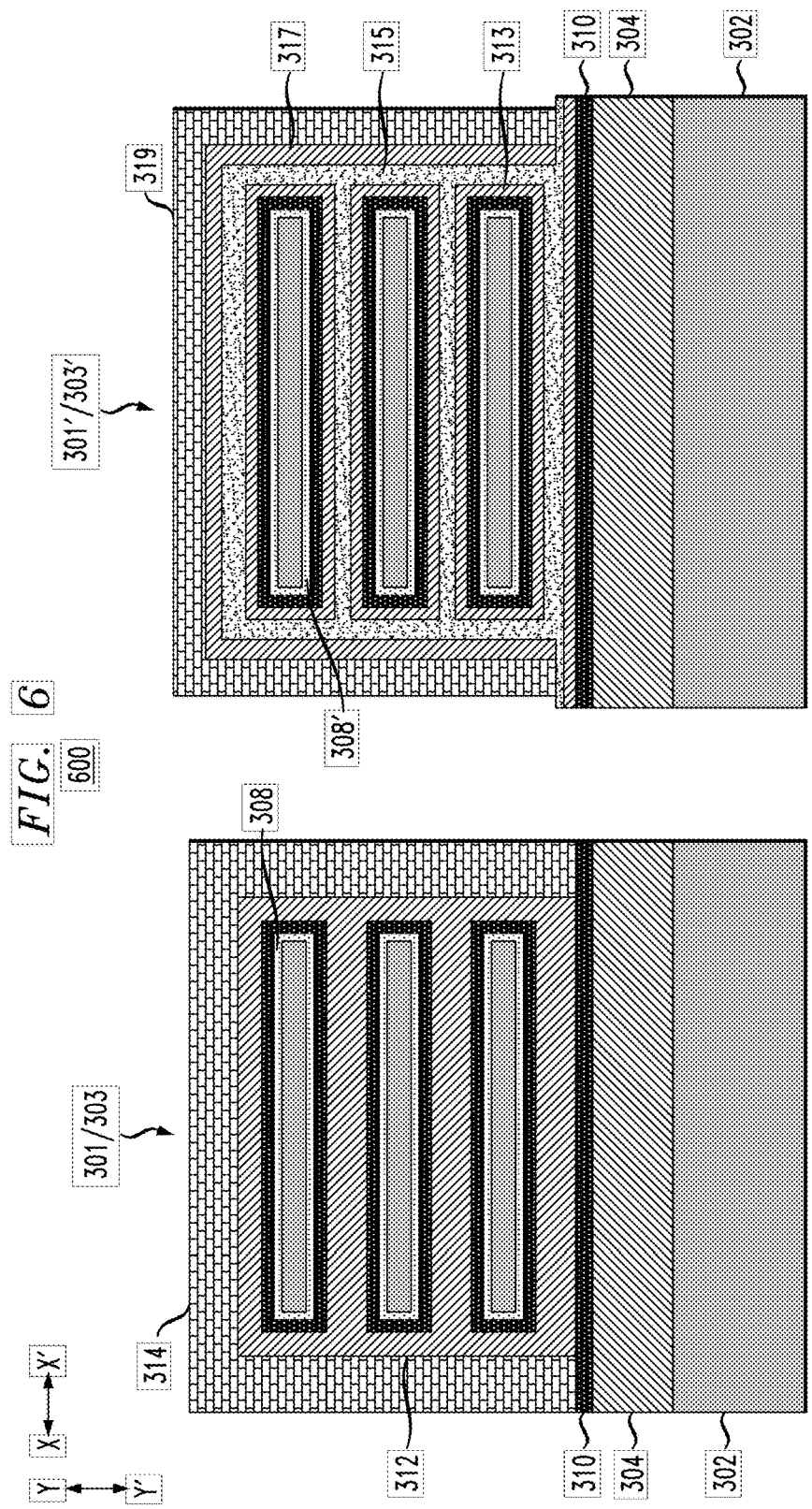
FIG. 6 depicts a cross-sectional view of the FIG. 5 structure following an anneal that thins the interfacial layer in regions of the semiconductor structure where the capping layer includes an aluminum-containing alloy disposed between the nanosheet channels, according to an embodiment of the present invention.

FIG. 6 shows a cross-sectional view 600 of the FIG. 5 structure following an anneal process that reduces a thickness of the IL in the regions 301' and 303'. The anneal process results in a thinner IL 308' in the regions 301' and 303' due to the presence of the Al-containing layer 315 formed between the nanosheet channels 306 in the regions 301' and 303'. The regions 301 and 303, which do not have the Al-containing layer 315, do not undergo any IL scavenging and thus the thickness of the IL 308 in the regions 301 and 303 remains unchanged.

In some embodiments, the anneal process of FIG. 6 includes a spike anneal followed by a laser spike anneal (LSA). The spike anneal may take place at a temperature greater than 900° C., such as at a temperature of 970° C., for a duration in the range of 0.5 seconds (s) to 2.0 s. The LSA may take place at a temperature greater than 1100° C., such as at a temperature of 1250° C., for a duration in the range of 50 microseconds (μs) to 250 μs. In some embodiments, the LSA is performed after a RTA to reactivate the dopant in Si.

Figure 7:
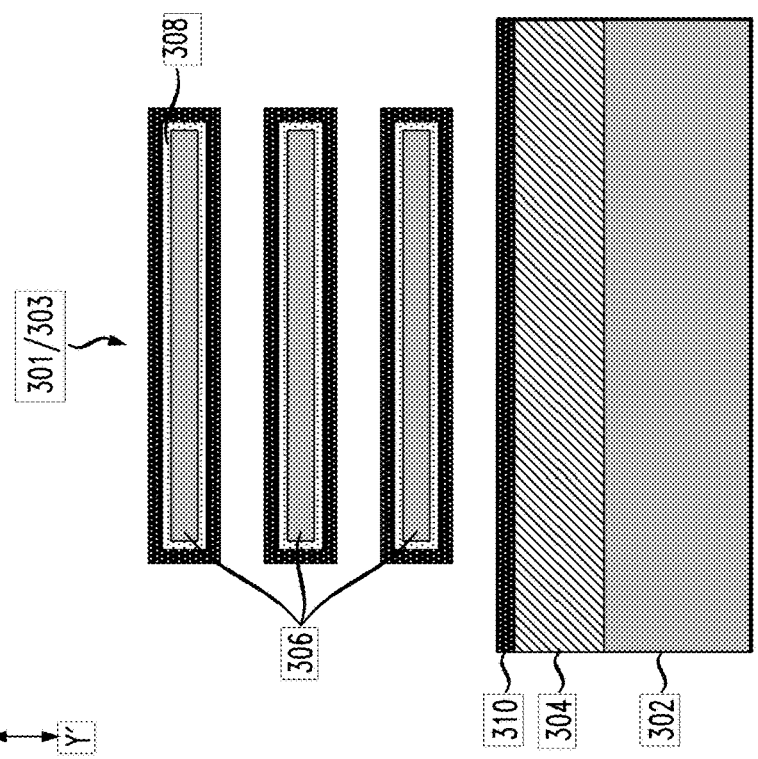
FIG. 7 depicts a cross-sectional view of the FIG. 6 structure following removal of the capping layers, according to an embodiment of the present invention.

FIG. 7 shows a cross-sectional view 700 of the FIG. 6 structure following removal of the layers 312, 314, 313, 315, 317 and 319 (e.g., removal of the TiN, TiAlC and a-Si). The a-Si layer may be removed by wet chemistries, such as ammonium hydroxide (NH$_4$OH). The capping layers may be removed by wet chemistries, such as SC1 or hydrogen peroxide (H$_2$O$_2$). As a result of the anneal described above with respect to FIG. 6, differential IL thickness is achieved in the different regions of the FIG. 7 structure. In the regions 301 and 303 corresponding to high Vt NFET and low Vt PFET devices, respectively, the IL 308 thickness may be greater than 5 Å. In the regions 301' and 303' corresponding to low Vt NFET and high Vt PFET devices, respectively, the IL 308' thickness may be thinner, such as approximately 4 Å or thinner as desired. In some embodiments, it is desired to have at least a minimal thickness of the IL 308' (e.g., at least 1 Å) in regions 301' and 303'.

Figure 8:
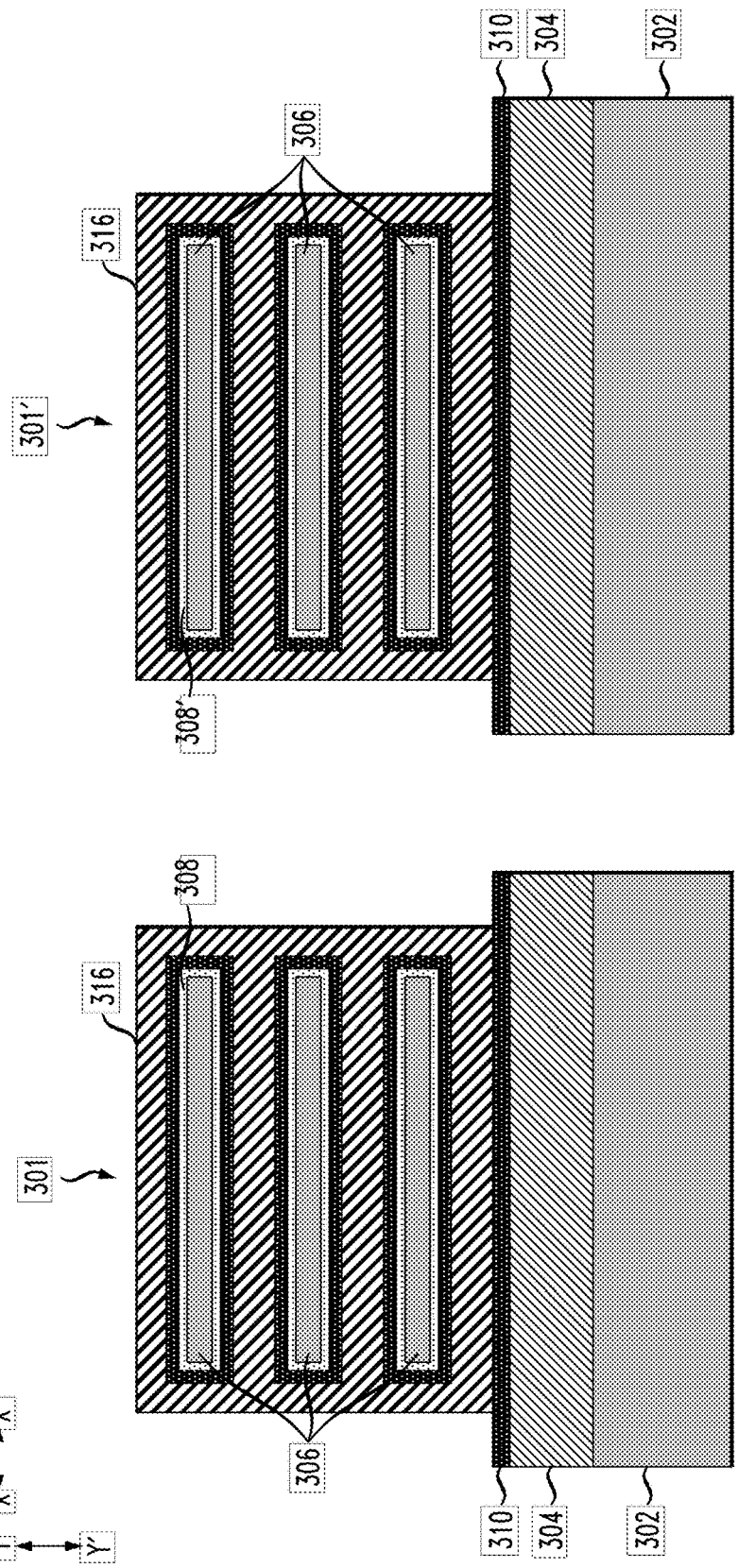
FIG. 8 depicts a cross-sectional view of the FIG. 7 structure following formation of a work function metal layer for high and low threshold voltage n-channel field-effect transistor regions, according to an embodiment of the present invention.

FIG. 8 shows a cross-sectional view of the FIG. 7 structure, more particularly the regions 301 and 301' of the FIG. 7 structure corresponding to the high Vt NFET and low Vt NFET devices, following formation of a work function metal (WFM) 316 surrounding the nanosheet channels 306. The WFM 316 in some embodiments includes a multilayer of TiN/TiAlC/TiN, such as 5 Å TiN, 15 Å TiAlC and 20 Å TiN. In other embodiments, the WFM 316 may be formed of other Al-containing alloys, such as TiAl, TaAlC, and TaAl.

Figure 9:
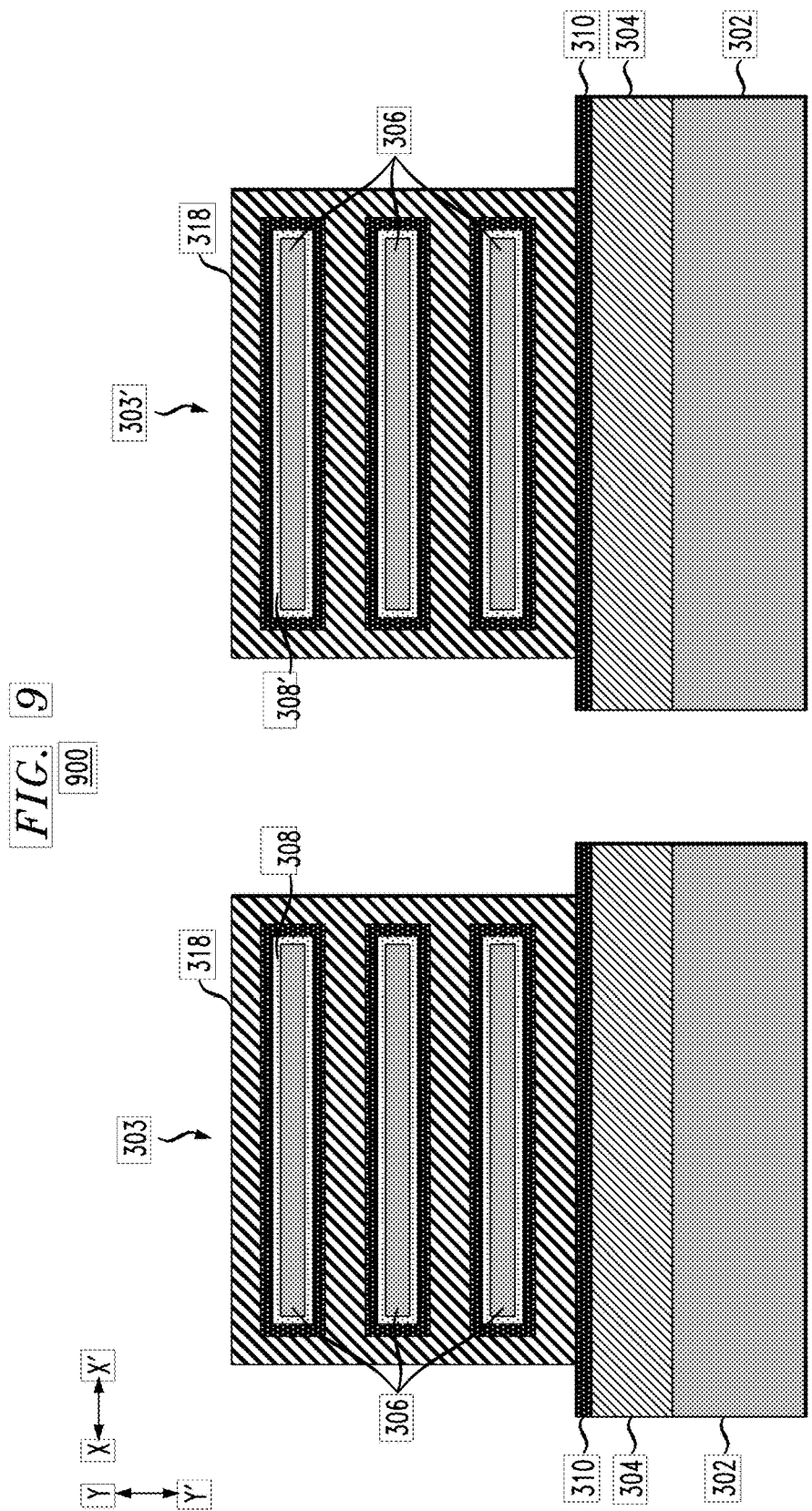
FIG. 9 depicts a cross-sectional view of the FIG. 7 structure following formation of a work function metal layer for low and high threshold voltage p-channel field-effect transistor regions, according to an embodiment of the present invention.

FIG. 9 shows a cross-sectional view of the FIG. 7 structure, more particularly the regions 303 and 303' of the FIG. 7 structure corresponding to the low Vt PFET and high Vt PFET devices, following formation of a WFM 318 surrounding the nanosheet channels 306. The WFM 318 in some embodiments includes TiN, such as 40 Å thick TiN. In other embodiments, the WFM 318 may be formed of tungsten (W).

The structure shown in FIGS. 8 and 9 may be subject to further processing, such as replacement metal gate processes, which includes deposition of low resistivity metal (e.g., W, Al) to fill the remaining portion of the gate trench, and chemical mechanical polishing (CMP) to remove overflown metal layers and to isolate FETs.

Advantageously, the techniques described herein for forming multiple work function nanosheet FETs with differential IL thickness do not increase the electrical thickness of the devices (e.g., there is no or minimal increase in the inversion thickness $T_{inv}$).

In some embodiments, a semiconductor structure comprises a substrate, an isolation layer disposed over the substrate, a plurality of nanosheet channels, interfacial layers surrounding each of the nanosheet channels and dielectric layers surrounding each of the interfacial layers. The plurality of nanosheet channels comprise a first set of two or more nanosheet channels for a first NFET, a second set of two or more nanosheet channels for a second NFET, a third set of two or more nanosheet channels for a first PFET and a fourth set of two or more nanosheet channels for a second PFET. The interfacial layers surrounding the first set of two or more nanosheet channels for the first NFET and the interfacial layers surrounding the third set of two or more nanosheet channels for the first PFET have a first thickness. The interfacial layers surrounding the second set of two or more nanosheet channels for the second NFET and the interfacial layers surrounding the fourth set of two or more nanosheet channels for the second PFET have a second thickness smaller than the first thickness.

The plurality of nanosheet channels may comprise Si, the interfacial layers may comprise $SiO_2$, and the dielectric layers may comprise $HfO_2$.

The first thickness may be greater than 5 Å and the second thickness may be less than 5 Å, the first NFET has a higher threshold voltage than the second NFET, and the first PFET has a lower threshold voltage than the second PFET.

The semiconductor structure may further comprise a first work function metal surrounding the first set of two or more nanosheet channels for the first NFET and the second set of two or more nanosheet channels for the second NFET, and a second work function metal different than the first work function metal surrounding the third set of two or more nanosheet channels for the first PFET and the fourth set of two or more nanosheet channels for the second PFET. The first work function metal may comprise a multilayer of TiN, an aluminum-containing alloy, and TiN. The second work function metal may comprise TiN. The aluminum-containing alloy may comprise TiAlC.

In some embodiments, an integrated circuit comprises a nanosheet FET device comprising a substrate, an isolation layer disposed over the substrate, a plurality of nanosheet channels, interfacial layers surrounding each of the nanosheet channels, and dielectric layers surrounding each of the interfacial layers. The plurality of nanosheet channels comprising a first set of two or more nanosheet channels for a first NFET, a second set of two or more nanosheet channels for a second NFET, a third set of two or more nanosheet channels for a first PFET and a fourth set of two or more nanosheet channels for a second PFET. The interfacial layers surrounding the first set of two or more nanosheet channels for the first NFET and the interfacial layers surrounding the third set of two or more nanosheet channels for the first PFET have a first thickness. The interfacial layers surrounding the second set of two or more nanosheet channels for the second NFET and the interfacial layers surrounding the fourth set of two or more nanosheet channels for the second PFET have a second thickness smaller than the first thickness.

The first thickness may be greater than 5 Å and the second thickness may be less than 5 Å, the first NFET has a higher threshold voltage than the second NFET, and the first PFET has a lower threshold voltage than the second PFET.

The integrated circuit may further comprise a first work function metal surrounding the first set of two or more nanosheet channels for the first NFET and the second set of two or more nanosheet channels for the second NFET, and a second work function metal different than the first work function metal surrounding the third set of two or more nanosheet channels for the first PFET and the fourth set of two or more nanosheet channels for the second PFET.

In some embodiments, a method of forming a semiconductor structure comprises forming a plurality of nanosheet channels disposed over an isolation layer disposed over a substrate, the plurality of nanosheet channels comprising a first set of two or more nanosheet channels for a first NFET, a second set of two or more nanosheet channels for a second NFET, a third set of two or more nanosheet channels for a first PFET and a fourth set of two or more nanosheet channels for a second PFET. The method also comprises forming interfacial layers surrounding each of the nanosheet channels, forming dielectric layers surrounding each of the nanosheet channels, forming a first capping metal layer over the first set of two or more nanosheet channels for the first NFET and the third set of two or more nanosheet channels for the first PFET, forming a second capping metal layer different than the first capping metal layer over the second set of two or more nanosheet channels for the second NFET and the fourth set of two or more nanosheet channels for the second PFET, and performing an anneal to selectively thin the interfacial layers surrounding the second set of two or more nanosheet channels for the second NFET and the fourth set of two or more nanosheet channels for the second PFET.

Subsequent to the anneal, the interfacial layers surrounding the first set of two or more nanosheet channels for the first NFET and the interfacial layers surrounding the third set of two or more nanosheet channels for the first PFET have a first thickness, the interfacial layers surrounding the second set of two or more nanosheet channels for the second NFET and the interfacial layers surrounding the fourth set of two or more nanosheet channels for the second PFET have a second thickness smaller than the first thickness, the first NFET has a higher threshold voltage than the second NFET, and the first PFET has a lower threshold voltage than the second PFET. The first thickness may be greater than 5 Å and the second thickness may be less than 5 Å.

The anneal may comprise a spike anneal at a first temperature followed by a laser spike anneal at a second temperature greater than the first temperature. The first temperature may be greater than 900° C. and the second temperature may be greater than 1100° C.

The first capping metal may comprise a multilayer comprising an aluminum-containing alloy layer disposed between nanosheet channels in the first set of two or more nanosheet channels for the first NFET and disposed between nanosheet channels in the third set of two or more nanosheet channels for the first PFET. The nanosheet channels may comprise Si and the interfacial layers may comprise $SiO_2$. The aluminum-containing alloy layer may comprise TiAlC. The multilayer may comprise a first TiN layer disposed surrounding the first set of two or more nanosheet channels for the first NFET and the third set of two or more nanosheet channels for the first PFET, the aluminum-containing alloy layer disposed surrounding the first TiN layer and pinching off spaces between the first set of two or more nanosheet channels for the first NFET and the third set of two or more nanosheet channels for the first PFET, and a second TiN layer surrounding the aluminum-containing alloy layer. The second capping metal may comprise a third TiN layer surrounding and pinching off spaces between the second set of two or more nanosheet channels for the second NFET and the fourth set of two or more nanosheet channel for the second PFET. The method may further comprise forming an amorphous silicon (a-Si) layer over the first capping metal and the second capping metal.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOS s), metal-oxide-semiconductor field-effect transistors (MOSFETs), and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming a plurality of nanosheet channels disposed over an isolation layer disposed over a substrate, the plurality of nanosheet channels comprising a first set of two or more nanosheet channels for a first negative-channel field-effect transistor (NFET), a second set of two or more nanosheet channels for a second NFET, a third set of two or more nanosheet channels for a first positive-channel field-effect transistor (PFET) and a fourth set of two or more nanosheet channels for a second PFET;
    forming interfacial layers surrounding each of the nanosheet channels; forming dielectric layers surrounding each of the nanosheet channels; forming a first capping metal layer over the first set of two or more nanosheet channels for the first NFET and the third set of two or more nanosheet channels for the first PFET;
    forming a second capping metal layer different than the first capping metal layer over the second set of two or more nanosheet channels for the second NFET and the fourth set of two or more nanosheet channels for the second PFET; performing an anneal to selectively thin the interfacial layers surrounding the second set of two or more nanosheet channels for the second NFET and the fourth set of two or more nanosheet channels for the second PFET; and
    wherein, subsequent to the anneal: the interfacial layers surrounding the first set of two or more nanosheet channels for the first NFET and the interfacial layers surrounding the third set of two or more nanosheet channels for the first PFET have a first thickness; the interfacial layers surrounding the second set of two or more nanosheet channels for the second NFET and the interfacial layers surrounding the fourth set of two or more nanosheet channels for the second PFET have a second thickness smaller than the first thickness; the first NFET has a higher threshold voltage than the second NFET; and the first PFET has a lower threshold voltage than the second PFET.

2. The method of claim 1, wherein the first thickness is greater than five angstroms (Å) and the second thickness is less than five Å.

3. The method of claim 1, wherein the anneal comprises a spike anneal at a first temperature followed by a laser spike anneal at a second temperature greater than the first temperature.

4. The method of claim 3, wherein the first temperature is greater than 900 degrees Celsius (° C.) and the second temperature is greater than 1100° C.

5. The method of claim 1, wherein the first capping metal comprises a multilayer comprising an aluminum-containing alloy layer disposed between nanosheet channels in the first set of two or more nanosheet channels for the first NFET and disposed between nanosheet channels in the third set of two or more nanosheet channels for the first PFET.

6. The method of claim 5, wherein the nanosheet channels comprise silicon (Si) and the interfacial layers comprise silicon dioxide ($SiO_2$).

7. The method of claim 5, wherein the aluminum-containing alloy layer comprises titanium aluminum carbide (TiAlC).

8. The method of claim 5, wherein the multilayer comprises:
- a first titanium nitride (TiN) layer disposed surrounding the first set of two or more nanosheet channels for the first NFET and the third set of two or more nanosheet channels for the first PFET;
- the aluminum-containing alloy layer disposed surrounding the first TiN layer and pinching off spaces between the first set of two or more nanosheet channels for the first NFET and the third set of two or more nanosheet channels for the first PFET; and
- a second TiN layer surrounding the aluminum-containing alloy layer.

9. The method of claim 7, wherein the second capping metal comprises a third TiN layer surrounding and pinching off spaces between the second set of two or more nanosheet channels for the second NFET and the fourth set of two or more nanosheet channel for the second PFET.

10. The method of claim 8, further comprising forming an amorphous silicon (a-Si) layer over the first capping metal and the second capping metal.

* * * * *